(12) United States Patent
Lee

(10) Patent No.: US 9,337,401 B2
(45) Date of Patent: May 10, 2016

(54) LIGHT EMITTING DEVICE PACKAGE

(75) Inventor: Sangyoul Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 1099 days.

(21) Appl. No.: 13/366,945

(22) Filed: Feb. 6, 2012

(65) Prior Publication Data

US 2012/0134137 A1   May 31, 2012

(30) Foreign Application Priority Data

May 26, 2011   (KR) .................. 10-2011-0050074

(51) Int. Cl.
| | | |
|---|---|---|
| F21V 3/00 | (2015.01) | |
| F21V 5/00 | (2015.01) | |
| H01L 33/56 | (2010.01) | |
| H01L 33/50 | (2010.01) | |

(52) U.S. Cl.
CPC .............. *H01L 33/56* (2013.01); *H01L 33/50* (2013.01); *H01L 2933/0091* (2013.01)

(58) Field of Classification Search
CPC .......... F21V 15/00; F21V 7/00; G09F 13/04; H01L 33/52; H01L 33/56
USPC .............. 362/97.1, 249.02, 293, 311.02, 800
See application file for complete search history.

(56) References Cited

U.S. PATENT DOCUMENTS

| | | | | |
|---|---|---|---|---|
| 8,310,622 | B2* | 11/2012 | Ha et al. ................ | 349/64 |
| 2006/0051704 | A1* | 3/2006 | Maekawa et al. .......... | 430/270.1 |
| 2007/0194341 | A1 | 8/2007 | Chang et al. | |
| 2007/0201246 | A1* | 8/2007 | Yeo et al. ............... | 362/627 |
| 2009/0114938 | A1 | 5/2009 | Hsu et al. | |
| 2009/0152582 | A1 | 6/2009 | Chang et al. | |
| 2010/0025709 | A1 | 2/2010 | Koseki et al. | |
| 2010/0289048 | A1 | 11/2010 | Kumura | |
| 2012/0019743 | A1* | 1/2012 | Chen et al. .............. | 349/65 |

FOREIGN PATENT DOCUMENTS

EP   2 308 909 A1   4/2011

OTHER PUBLICATIONS

Chinese Office Action dated Nov. 27, 2015 issued in Application No. 201210052646.5.
European Search Report issued in Application No. 12155002.4 dated Oct. 20, 2015.

* cited by examiner

*Primary Examiner* — Jason Moon Han
(74) *Attorney, Agent, or Firm* — Ked & Associates, LLP

(57) ABSTRACT

A light emitting device package according to one exemplary embodiment includes a sealing material and organic particles. The organic particles enhance a heat discharge rate and thus reliability of the light emitting device package due to excellent thermal characteristics thereof. Moreover, the organic particles achieve an optical distribution effect to enhance light extraction efficiency of the light emitting device package.

19 Claims, 13 Drawing Sheets

LIGHT EMITTING DEVICE PACKAGE

CROSS-REFERENCE TO RELATED APPLICATION

This application claims the priority benefit of Korean Patent Application No. 10-2011-0050074, filed on May 26, 2011 in the Korean Intellectual Property Office, the disclosure of which is incorporated herein by reference.

BACKGROUND

1. Field

Embodiments relate to a light emitting device package.

2. Description of the Related Art

Fluorescent lamps may be blackened at both end portions thereof and thus have a shortened lifespan. Therefore, the fluorescent lamps must be frequently replaced. Moreover, fluorescent lamps use a fluorescent substance which is not eco-friendly. For these reasons, fluorescent lamps are increasingly being replaced with different types of light sources.

As such different types of light sources, LEDs (light emitting diodes) have been increasingly employed because LEDs have a high processing rate of a semiconductor and lower power consumption and eco-friendliness. Accordingly, LEDs have been vigorously studied to substitute for fluorescent lamps.

Recently, semiconductor light emitting devices such as LEDs are being broadly applied to a variety of devices including television sets, monitors, notebooks, mobile phones, and displays. In particular, LEDs are applied to a backlight unit in place of a CCFL (cold cathode fluorescent lamp).

There is a demand for high luminance of LEDs in order to use LEDs as an illumination source. In order to achieve high luminance, there has been studied a light emitting device having an improved light emitting efficiency by uniformly diffusing electrical current.

Moreover, there has been studied a light emitting device package to mount such a light emitting device thereon, which has an improved light extraction efficiency and heat discharge rate.

SUMMARY

One exemplary embodiment provides a light emitting device package having a novel configuration.

One exemplary embodiment provides a light emitting device package having an enhanced light extraction efficiency.

One exemplary embodiment provides a light emitting device package having an enhanced heat discharge rate and thus enhanced reliability.

A light emitting device package according to one exemplary embodiment includes a light source, a lead frame to mount the light source thereon and being electrically connected to the light source, the lead frame comprising first and second electrically conductive lead frames being spaced from each other, and a mold member disposed over the light source and including a sealing material and organic particles over the lead frame. A proportion of the organic particles to the sealing material may be in a range of 1 wt % to 20 wt %.

One exemplary embodiment may enhance the light extraction efficiency of the light emitting device package.

One exemplary embodiment may enhance the heat discharge rate and thus reliability of the light emitting device package.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1A:
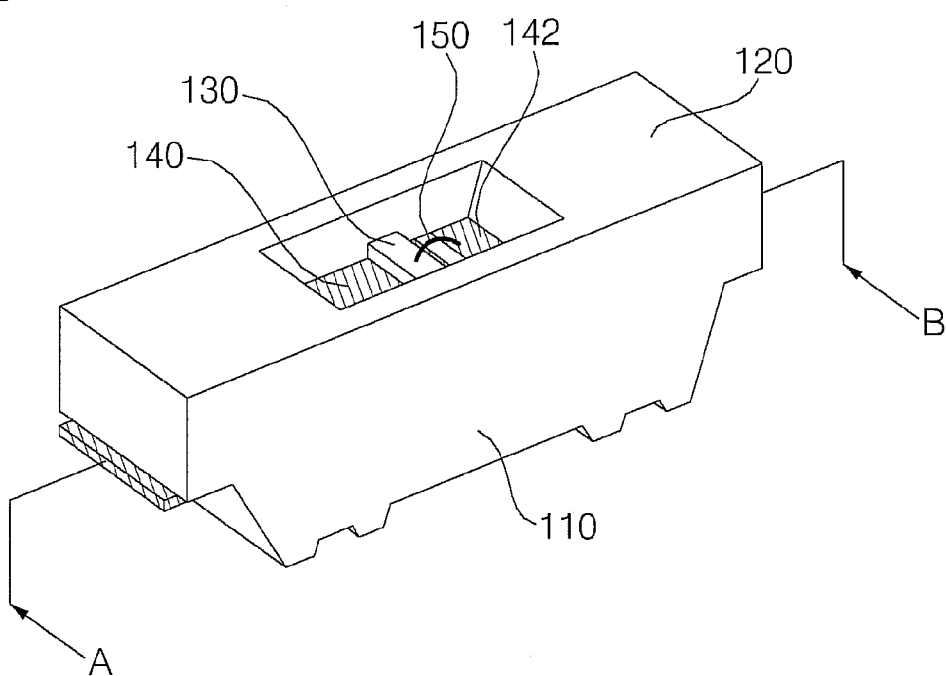
FIG. 1A is a perspective view of a light emitting device package according to one exemplary embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the subject matters of the claims.

In certain embodiments, detailed descriptions of device constructions or processes well known in the art may be omitted to avoid obscuring the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the figures. It will be understood that spatially-relative terms are intended to encompass different orientations of the device in addition to the orientations depicted in the figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein include the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

When describing a configuration of a light emitting device package in exemplary embodiments, angles and/or directions may be based on associated drawings. Unless a reference point with regard to angles and/or positional relationships are clearly expressed herein when describing a configuration of a light emitting device package in exemplary embodiments, the reference point and/or positional relationships may be based on associated drawings.

Hereinafter, embodiments will be described in detail with reference to the drawings.

Figure 1B:
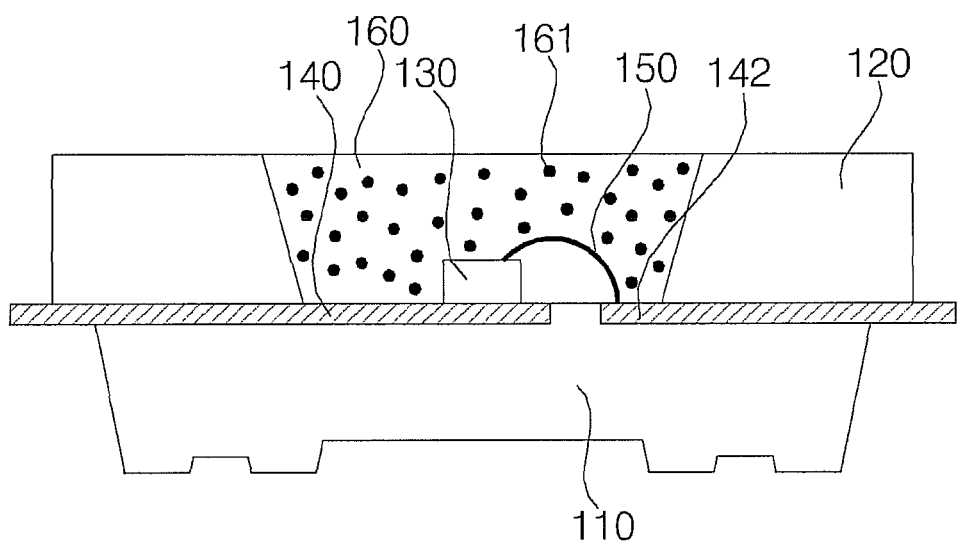
FIG. 1B is a cross-sectional view taken at a line A-B of the light emitting device package of FIG. 1A.
Figure 2:
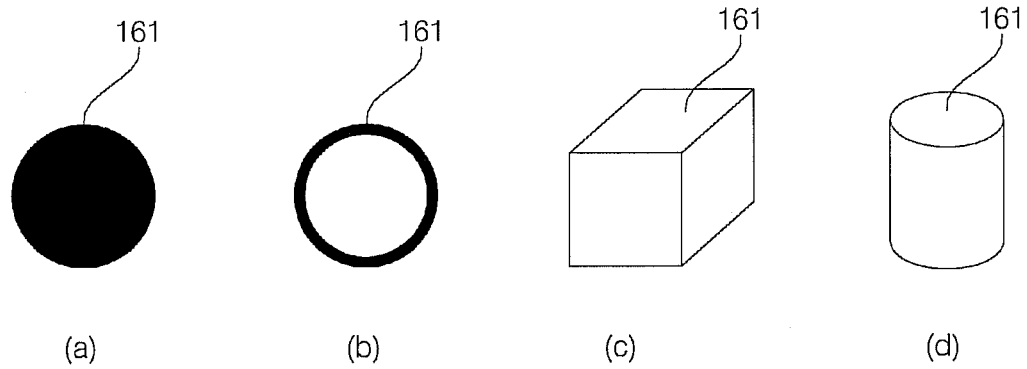
FIG. 2 is a schematic view of shapes of organic particles according to one exemplary embodiment.
Figure 3:
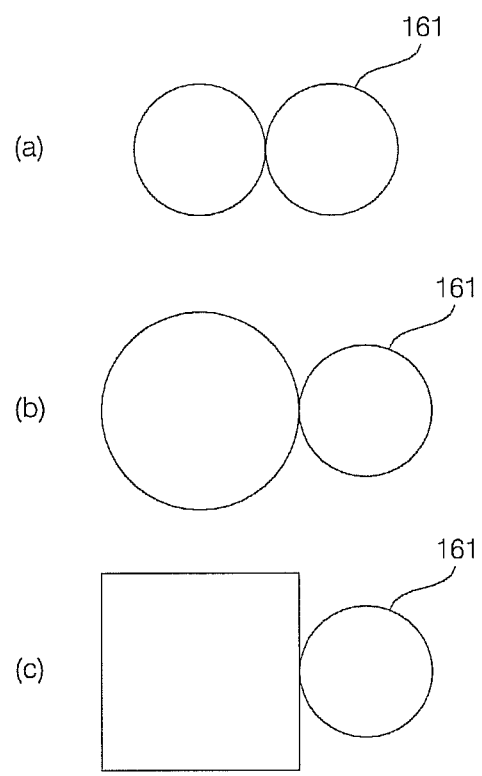
FIG. 3 is a schematic view of shapes of combinations between the organic particles according to one exemplary embodiment.
Figure 4:
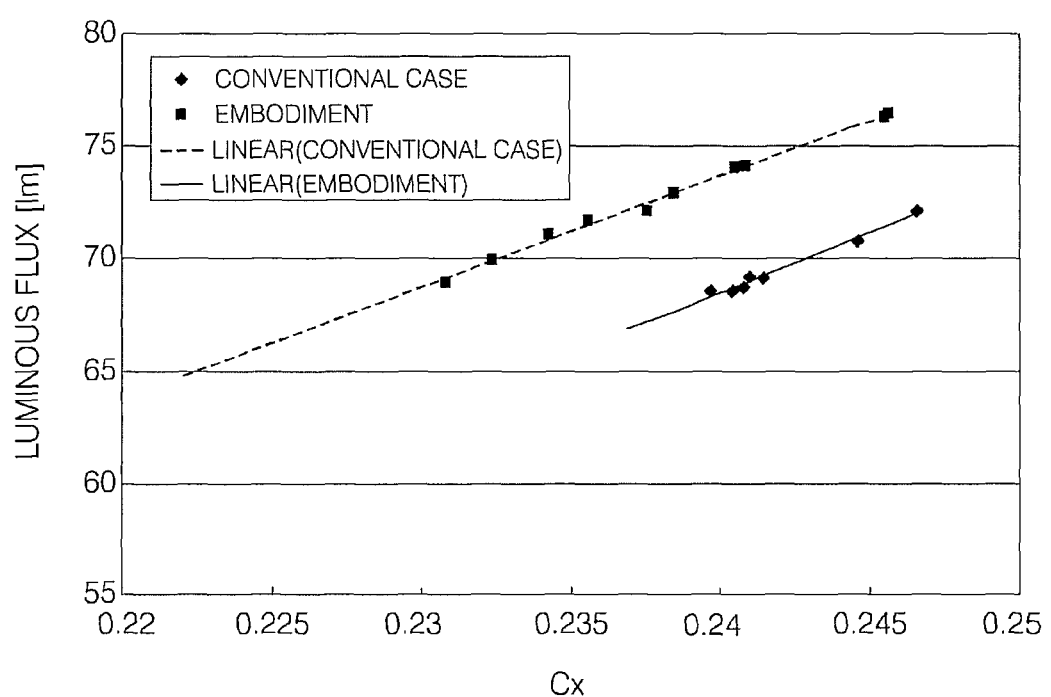
FIG. 4 is a graph illustrating a comparison of luminous intensities between a conventional light emitting device package and the light emitting device package according to one exemplary embodiment.
Figure 5:
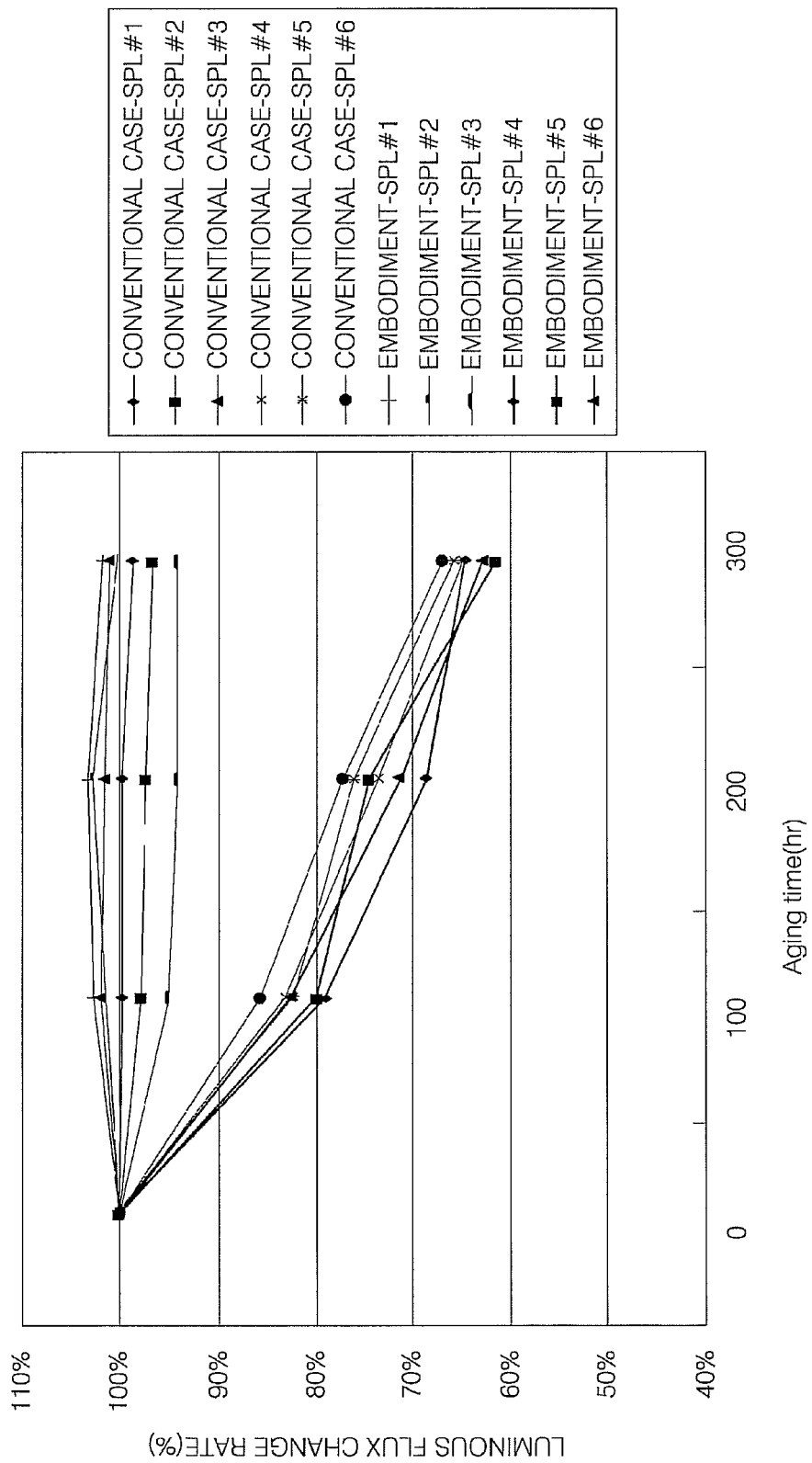
FIG. 5 is a graph illustrating a comparison of luminous intensity change rates depending on aging time between a conventional light emitting device package and the light emitting device package according to one exemplary embodiment.

FIG. 1A is a perspective view of a light emitting device package according to one exemplary embodiment. FIG. 1B is a cross-sectional view taken at a line A-B of the light emitting device package of FIG. 1A. FIG. 2 is a schematic view of shapes of organic particles according to one exemplary embodiment. FIG. 3 is a schematic view of coupling shapes between the organic particles according to one exemplary embodiment. FIG. 4 is a graph illustrating a comparison of luminous intensities between a conventional light emitting device package and the light emitting device package according to one exemplary embodiment. FIG. 5 is a graph illustrating a comparison of luminous intensity change rates depending on aging time between a conventional light emitting device package and the light emitting device package according to one exemplary embodiment.

Referring to FIG. 1A and FIG. 1B, there is illustrated a light emitting device package 100 according to one exemplary embodiment. The light emitting device package 100 includes a light source 130, lead frames 140 and 142 to mount the light source 130 thereon and a mold member to encompass and protect the light source 130.

The light emitting device package 100 further includes a body including body portions 110 and 120 and having a cavity formed therein so as to accommodate the light source 130. The mold member may fill the cavity.

The light source 130 is electrically connected to the lead frames 140 and 142. For example, the light source 130 may be light emitting diodes.

The light emitting diodes may be color light emitting diodes emitting red, green, blue, white light, etc. or may be UV light emitting diodes emitting ultra-violet light. The present disclosure is not limited thereto. One or more light emitting diodes may be mounted on the lead frames.

The light emitting diodes may be configured in a horizontal form wherein all electrical terminals thereof are formed at an upper surface thereof. Alternatively, the light emitting diodes may be configured in a vertical form wherein the electrical terminals thereof are formed at upper and lower surfaces thereof. Alternatively, the light emitting diode may be configured in a flip-chip form.

As shown in FIG. 1B, a lead frame includes the two lead frames 140 and 142 spaced from each other. However, the lead frame may be a single lead frame. The present disclosure is not limited thereto.

The lead frames 140 and 142 may be made of an electrically conductive material such as a metal. For example, the lead frames 140 and 142 may be made of one or more selected from a group consisting of titanium (Ti), copper (Cu), nickel (Ni), gold (Au), chromium (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf) ruthenium (Ru) and iron (Fe) and may include an alloy of thereof. The lead frames 140 and 142 may be formed to include a single layer structure or a multi-layer structure. The present disclosure is not limited thereto.

Herein, the lead frame includes first and second lead frames 140 and 142. The first lead frame 140 is spaced from and thus is electrically isolated from the second lead frame 142. The first lead frame 140 is in direct contact with the light source 130 or is electrically connected to the light source 130 via an electrically conductive material. The second lead frame 142 is electrically connected to the light source 130 via a bonding wire 150. In this way, when the first and second lead frames 140 and 142 are connected to a power supply, electrical power is supplied to the light source 130. As mentioned above, the light source 130 is mounted on the first lead frame 140 and the first and second lead frames 140 and 142 are electrically connected to each other via the bonding wire 150, although the present disclosure is not limited thereto.

The mold member is formed to encompass and protect the light source 130. The shape of the mold member is not limited to a particular shape but may include various shapes. The mold member may include a sealing material 160 and organic particles 161. This will be described in detail later.

The body includes the body portions 110 and 120 having the cavity formed therein so as to accommodate the light source 130. The body portions 110 and 120 may be formed to receive portions of the lead frames 140 and 142.

The body portions 110 and 120 may be made of at least one selected from among a resin such as polyphthalamide (PPA), silicon (Si), aluminum (Al), aluminum nitride (AlN), a liquid crystal polymer such as photosensitive glass (PSG), polyamide 9T (PA9T), syndiotactic polystyrene (SPS), a metal, sapphire ($Al_2O_3$), beryllium oxide (BeO), and a Printed Circuit Board (PCB). The body portions 110 and 120 may be fabricated by injection molding, etching or the like, although the present disclosure is not limited thereto.

The body portions 110 and 120 may include an inclined inner surface and thus, the reflection angle of light emitted from the light source 130 may be determined based on the inclination angle of the inner surface of the body 110. As such, the body portions 110 and 120 may function to adjust the orientation angle of light to be extracted to the outside.

The smaller the orientation angle of light, the greater the convergence of light emitted from the light source 130 to the outside. On the contrary, the greater the orientation angle of light, the smaller the convergence of light emitted from the light source 130 to the outside.

When viewing the cavity formed in the body portions 110 and 120 from the upper side, the cavity may include a circular, rectangular, polygonal, elliptical shape or the like and may include rounded corners, although the present disclosure is not limited thereto.

The body includes the bottom body portion 110 forming a bottom of the body and a wall body portion 120 disposed on the bottom body portion 110 to form the cavity together with the bottom body portion 110. The wall body portion 120 has a shape corresponding to that of the cavity.

A reflective layer may be formed on a side wall surface of the cavity. That is, the reflective layer may be formed on an inner side face of the wall body portion 120.

In this regard, the reflective layer may be made of a material exhibiting high reflectance. The reflective layer may be made of a metal material including at least one of Ag, Ni, Al, Rh, Pd, Ir, Ru, Mg, Zn, Pt, Au, and Hf, or an alloy thereof. The reflective layer may include a multilayer structure using the above-described metal material or alloy thereof and a material having light transmitting properties and conductivity such as indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) or antimony tin oxide (ATO). In detail, the reflective layer may include a multilayer structure such as IZO/Ni, AZO/Ag, IZO/Ag/Ni, AZO/Ag/Ni, Ag/Cu, or Ag/Pd/Cu. That is, by stacking plural layers having different refractive indices, most of the light generated from the light source 130 may be totally reflected upward of the light emitting device package 100, thereby enhancing light extraction efficiency.

Referring to FIG. 1B, the mold member uses the sealing material 160 to protect the light source 130. The filled mold member may prevent the light source 130 from forming a short circuit due to external contaminants or moisture. The mold member may include the sealing material and organic particles 161.

The sealing material 160 may be made of silicon, epoxy resin or another resin material. The sealing material 160 fills the cavity and then is cured using ultra-violet light or heat. The sealing material 160 may be transparent. The present disclosure is not limited thereto.

The sealing material 160 may further include a light diffusive material (not shown) to diffuse light emitted from the light source 130. The diffusive material may be any one selected from white metal oxides including titanium dioxide ($TiO_2$), barium oxide (BaO), silicon dioxide ($SiO_2$), magnesium oxide (MgO) and yttrium oxide ($Y_2O_3$). Alternatively, the diffusive material may be a mixture of two or more selected from titanium dioxide ($TiO_2$), barium oxide (BaO), silicon dioxide ($SiO_2$), magnesium oxide (MgO) and yttrium oxide ($Y_2O_3$). The diffusive material may diffusively reflect light generated by the light source 130.

The sealing material 160 may further contain a fluorescent substance. This will be described later.

The organic particles 161 may include, for example, at least one selected from a group consisting of PTFE (polytetrafluoroethylene), PSTm, phenolic resin, PMMA (polymethylmethacrylate), PVC and styrene-copolymer. At least one selected from a group consisting of PTFE (polytetrafluoroethylene), PSTm, phenolic resin, PMMA (polymethylmethacrylate), PVC and styrene-copolymer may be contained in the sealing material at 0.5 wt % to 30 wt % or 1 wt % to 20 wt %. That is, the organic particles 161 may be made of a single substance or multiple substances. The present disclosure is not limited thereto.

An index of refraction of the sealing material 160 may be finely adjusted based on the proportion of the organic particles 161. Thus, the index of refraction of the sealing material 160 may be adjusted to be suitable for the light emitting device package 100. Ultimately, the organic particles 161 may suppress total reflection of light in the light emitting device package 100, thereby enhancing light extraction efficiency. Moreover, it is easy for the mold member to include an index of refraction to suppress total reflection by adjusting the proportion of the organic particles 161 depending on a material of the sealing material 160.

The organic particles 161 may include a higher thermal conductivity than that of the general sealing material 160. Thus, the mold member containing the organic particles 161 may enhance a heat discharge rate of the light emitting device package 100, thereby improving the reliability of the light emitting device package 100. FIG. 5 is a graph illustrating a comparison test result of luminous intensity change rates depending on aging time between a conventional light emitting device package not containing the organic particles 161 and the light emitting device package 100 according to one exemplary embodiment. As seen from FIG. 5, the conventional light emitting device package has a larger luminous intensity change rate depending on aging time, whereas the light emitting device package 100 according to one exemplary embodiment has a smaller luminous intensity change rate depending on aging time. Accordingly, the light emitting device package 100 according to one exemplary embodiment suppresses luminous intensity reduction due to time aging, thereby having a higher reliability.

In the mold member, the organic particle 161 may be mixed with the sealing material 160 and be dispersed therein. The organic particles 161 may be uniformly dispersed in the mold member. The present disclosure is not limited thereto. The uniformly dispersed organic particles 161 achieve excellent optical characteristics.

A shape of the organic particles 161 is not limited to a particular shape. Referring to FIG. 2, for example, the shape of the organic particles 161 may be any one of a sphere, cube, hexahedron, cylinder and regular polyhedron.

The organic particles 161 may be formed as combinations of two or more of the sphere, cube, hexahedron, cylinder and regular polyhedron. Such combinations are shown in FIG. 3. The present disclosure is not limited thereto.

The organic particles 161, all having a single shape, may be dispersed. Alternatively, the organic particles 161 having two or more different shapes may be dispersed. The present disclosure is not limited thereto.

The organic particles 161 may be coated with a coating layer (not shown). The coating layer may be made of a material having a different index of refraction than that of the organic particles 161. The coating layer may include a higher index of refraction than that of the organic particles 161. Further, as shown in (b) of FIG. 2, each of the organic particles 161 may include a hollow space therein. The hollow space is filled with air.

Based on Snell's law, when light travels from a material having a higher index of refraction to a material having a lower index of refraction, the light is totally reflected at an interface of the two materials having different indices of refraction if an incidence angle of the light is greater than a critical angle.

Thus, if the index of refraction of the coating layer is greater than the index of refraction of the organic particle 161, total reflection may occur at an interface between the coating layer and the organic particle 161. This may prevent light from passing through the organic particle 161 or may suppress loss of light within the organic particle 161, thereby enhancing light extraction efficiency. When each of the organic particles 161 has the hollow space therein, total reflection may occur at an interface between the hollow space and the organic particle 161 because the hollow space is filled with air whose index of refraction is 1 and thus the hollow space has a lower index of refraction than that of the organic particle 161. As such, light extraction efficiency may be enhanced.

The index of refraction of each of the organic particles 161 may be in a range of 1.4 to 2.0. The index of refraction of the organic particle 161 may be in a range of 1.6 to 1.7. An overall index of refraction of the mold member may be determined as a weighted average of the refractive indices of the organic particles 161 and sealing material 160. Therefore, by adjusting the proportion in wt % of the organic particles 161, the overall index of refraction of the mold member may be finely controlled. Since the index of refraction of the mold member may be finely and broadly adjusted, various applications of the light emitting device package 100 are advantageously feasible. The proportion of the organic particles 161 to the sealing material 160 may be in a range of 0.5 wt % to 30 wt %. The proportion of the organic particles 161 to the sealing material 160 may be in a range of 1 wt % to 20 wt %.

FIG. 4 illustrates a comparison test result of luminous intensities between a conventional light emitting device package without the organic particles 161 and the light emitting device package 100 according to one exemplary embodiment. As can be seen from FIG. 4, the light emitting device package 100 according to one exemplary embodiment has larger luminous intensity than the conventional light emitting device package by an average of 5%.

Because the index of refraction of the sealing material 160 is greater than the index of refraction of ambient air, when light travels from the light source 130 to the ambient air, total reflection occurs at the interface between the mold member and ambient air in accordance with Snell's law if an incidence angle of the light is greater than a critical angle. In this way, a portion of light may totally reflect from the interface and then disappear in the mold member. However, in this embodiment, a portion of the light totally reflected from the interface may again totally reflect from the organic particles 161 uniformly dispersed in the mold member and then propagate from the mold member into the ambient air, thereby enhancing light extraction efficiency.

The size of each of the organic particles 161 may vary depending on the size of the light emitting device package 100. The size of each of the organic particles 161 is not limited to a particular size. The size of each of the organic particles 161 may be in a range of 1 nm to 80000 nm. When each of the organic particles 161 has the spherical shape, the size of the organic particles 161 means a diameter of each of the organic particles 161. When each of the organic particles 161 has a different shape from the spherical shape, the size of the organic particles 161 may mean a width.

Figure 6:
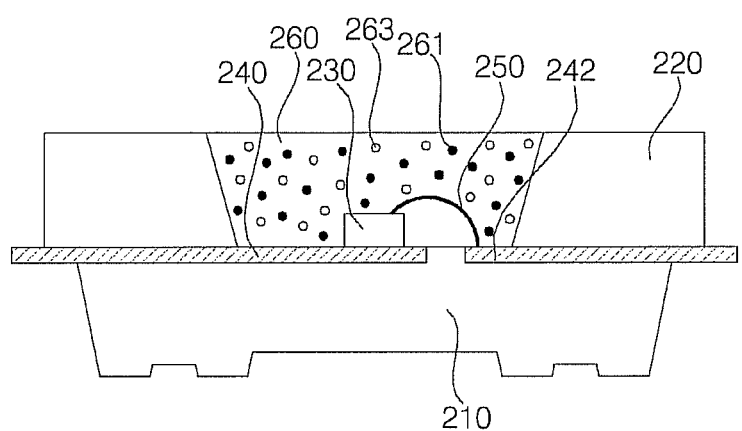
FIG. 6 is a cross-sectional view of a light emitting device package according to another exemplary embodiment.

FIG. 6 is a cross-sectional view of a light emitting device package 200 according to another exemplary embodiment.

Referring to FIG. 6, the light emitting device package 200 may further include fluorescent substances 263 contained in the sealing material 260, compared to the embodiment of FIG. 1. The components except for the fluorescent substances 263 are the same as in the embodiment of FIG. 1 and thus descriptions thereof will be omitted.

A type of the fluorescent substances 263 may be determined based on a wavelength of light emitted by the light source 230 so that the light emitting device package 200 renders white light.

The fluorescent substances 263 may be one selected from among a blue light emitting fluorescent substance, a bluish green light emitting fluorescent substance, a green light emitting fluorescent substance, a yellowish green light emitting fluorescent substance, a yellow light emitting fluorescent substance, a yellowish red light emitting fluorescent substance, an orange color light emitting fluorescent substance and a red light emitting fluorescent substance, based on a wavelength of light emitted by the light source 230.

The fluorescent substances 263 may be excited by first color light emitted from the light source 230 to generate second color light. For example, when the light source is a blue light emitting diode and the fluorescent substances 263 are yellow fluorescent substances, the yellow fluorescent substances are excited by blue light to generate yellow light. Thus, blue light generated by the blue light emitting diode and yellow light emitted by the yellow fluorescent substances are mixed, so that the light emitting device package 200 emits white light.

Similarly, when the light source 230 is a green light emitting diode, a magenta fluorescent substance is used or a mixture of blue and red fluorescent substances is used. When the light source 230 is a red light emitting diode, a cyan fluorescent substance is used or a mixture of blue and green fluorescent substances is used.

The fluorescent substances 263 may include a well-known fluorescent substance such as a YAG-based fluorescent substance, a TAG-based fluorescent substance, a sulfide-based fluorescent substance, a silicate-based fluorescent substance, an aluminate-based fluorescent substance, a nitride-based fluorescent substance, a carbide-based fluorescent substance, a nitridosilicate-based fluorescent substance, a borate-based fluorescent substance, a fluoride-based fluorescent substance, a phosphate-based fluorescent substance, etc.

Figure 7:
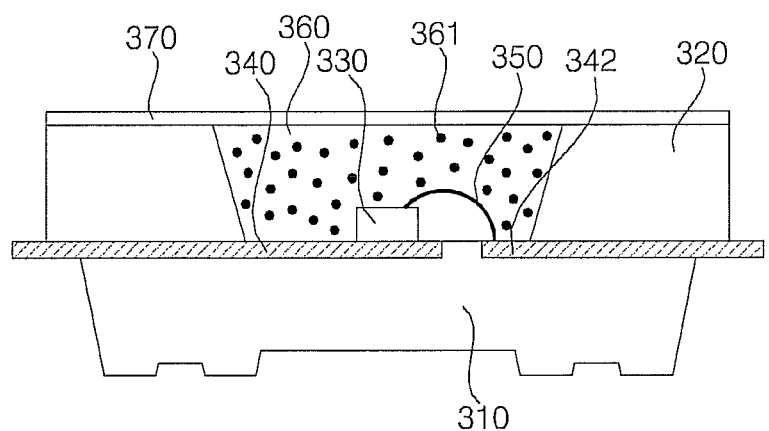
FIG. 7 is a cross-sectional view of a light emitting device package according to still another exemplary embodiment.

FIG. 7 is a cross-sectional view of a light emitting device package 300 according to still another exemplary embodiment.

Referring to FIG. 7, the light emitting device package 300 may further include a sheet 370 disposed on a body portion 320 to cover a cavity, compared to the exemplary embodiment of FIG. 1.

The sheet 370 may contain at least one selected from among titanium dioxide ($TiO_2$), silicon dioxide ($SiO_2$), zinc oxide (ZnO), barium sulfate ($BaSO_4$), calcium carbonate ($CaCO_3$), magnesium carbonate ($MgCO_3$), aluminum hydroxide ($Al(OH)_3$) and clay. When electrical power is not applied to the light emitting device package 300, the sheet 370 maintains a white color and thus causes a color of a light emitting portion of the light emitting device package 300 to be the white color, so that the light emitting device package 300 is in a harmony with an external environment for mounting the same.

The sheet 370 may be made of a resin layer having a matrix form. The resin layer having a matrix form may be made of a thermosetting resin exhibiting excellent light transmission and heat-resistance such as polyethylene terephthalate (PET), polycarbonate (PC), polymethylmethacrylate (PMMA), silicon resin, etc.

That is, the sheet 370 may be formed by uniformly dispersing particles made of at least one selected from among titanium dioxide ($TiO_2$), silicon dioxide ($SiO_2$), zinc oxide (ZnO), barium sulfate ($BaSO_4$), calcium carbonate ($CaCO_3$), magnesium carbonate ($MgCO_3$), aluminum hydroxide (Al$(OH)_3$) and clay in the above-mentioned thermosetting resin and curing the dispersion using heat or ultra-violet light.

A curing agent, dispersing agent, etc. may be further included in the above mentioned thermosetting resin. The curing agent serves to cure a liquid thermosetting resin and the dispersing agent serves to uniformly disperse the above-mentioned particles in the liquid thermosetting resin.

The sheet 370 serves not only to cause an appearance color of a light emitting portion of the light emitting device package 300 to be the white color, but also to prevent external contaminants from entering the cavity by covering a top side of the wall body portion 320.

Figure 8:
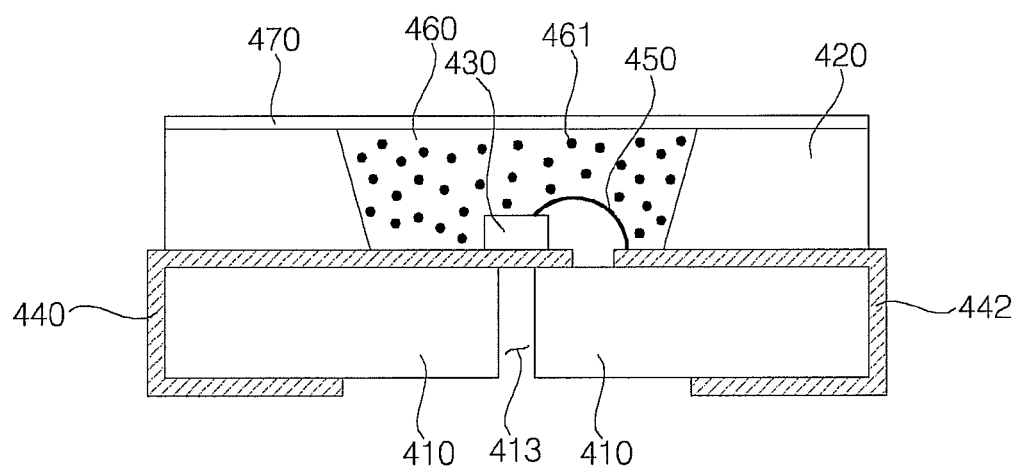
FIG. 8 is a cross-sectional view of a light emitting device package according to still another exemplary embodiment.

FIG. 8 is a cross-sectional view of a light emitting device package 400 according to still another exemplary embodiment.

Referring to FIG. 8, the light emitting device package 400 may further include a hole 413 formed in a bottom body portion 410 and disposed to face away from the light source 430.

The hole 413 serves as a heat sink to discharge heat generated from the light source 430.

Although now shown, the hole 413 may be coupled to a heat discharge plate (not shown) made of a metal material disposed beneath the hole 413. In this way, heat discharge rate may be further enhanced by coupling the hole 413 to the heat discharge plate made of a metal material with excellent heat discharge performance.

The hole 413 may be also applied to the above exemplary embodiments described with reference to FIG. 1 to FIG. 7.

Moreover, the light emitting device package 400 of FIG. 8 is different from that of the embodiment of FIG. 1 in terms of a shape of the lead frames.

Referring to FIG. 8, each of the lead frames 440 and 442 includes an inner terminal formed between bottom and wall body portions 410 and 420, and an outer terminal extending from the inner portion and exposed to the outside.

One portion of each of the inner terminals forms a bottom portion of the cavity formed in the bottom and wall body portions 410 and 420. The other portion of each of the inner terminals is formed at an end thereof beneath a bottom face of each of the wall body portions 420. The outer terminals extend from the corresponding inner terminals and are exposed to the outside of the body portions 410 and 420. In order to form electrodes of the light emitting device package 400, each of the outer terminals may be bent so as to contact the body portions 410 and/or 420. In FIG. 8, the outer terminals are bent so as to contact the bottom body portion 410. The present disclosure is not limited thereto.

Figure 9:
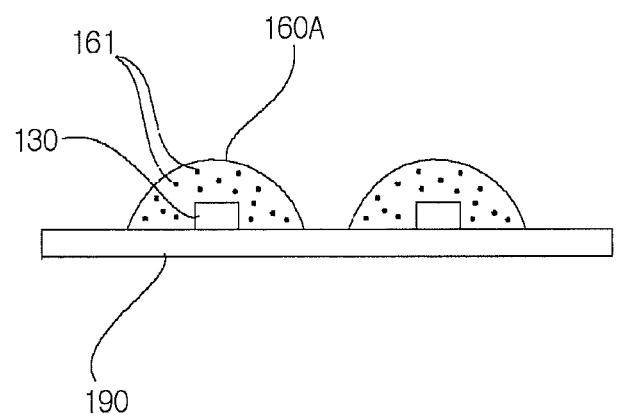
FIG. 9 is a cross-sectional view of a light emitting device package according to still yet another exemplary embodiment.

FIG. 9 is a cross-sectional view of a light emitting device package 100A according to still yet another exemplary embodiment.

Referring to FIG. 9, the light emitting device package 100A includes a substrate 190, a light source 130 mounted on the substrate 190 and a sealing material 160A disposed on the substrate 190 to encompass the light source 130 and containing organic particles 161.

The substrate 190 may include an electrically conductive electrode pattern (not shown) and an electrically insulative body (not shown) to encompass the electrode pattern so as to expose a portion of the same.

The body may be made of an electrically insulative material. For example, the body may be made of at least one selected from among FR-4, polyimide, liquid crystal polymer, polyester, PEN (polyethylene naphthalate) and PET (polyethylene terephthalate). The present disclosure is not limited thereto. The body may include a thin structure or be made of a light transmissive resin such that the electrode pattern embedded therein is visible from the outside. The present disclosure is not limited thereto. The body may be formed of a thin plate or film made of a flexible synthetic resin, etc. to form a flexible printed circuit board (FPCB) or may be formed of a multi-layer board including several layers. The present disclosure is not limited thereto.

The electrode pattern may be electrically connected to an electric or electronic device, and external electrical power may be applied to the electric or electronic device.

The sealing material 160 encompasses the light source 130 and may be formed in a convex shape to enhance diffusion efficiency of light.

The organic particles 161 may be contained in the sealing material 160. The organic particles 161 are the same as in the above mentioned description.

Figure 10:
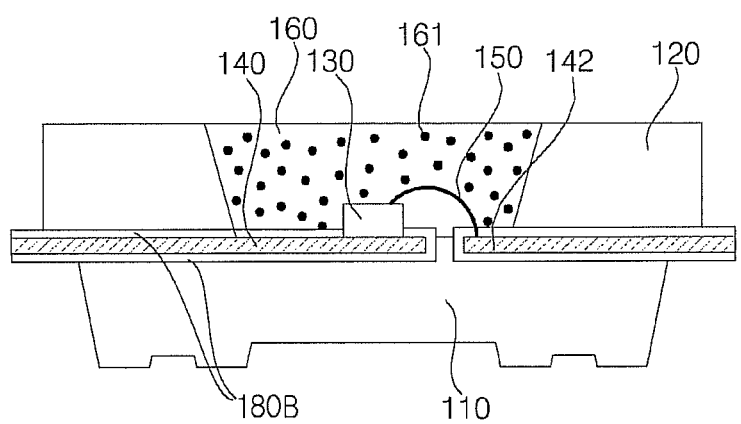
FIG. 10 is a cross-sectional view of a light emitting device package according to still yet another exemplary embodiment.

FIG. 10 is a cross-sectional view of a light emitting device package 100B according to still yet another exemplary embodiment.

Referring to FIG. 10, the light emitting device package 100B may further include an electrically insulative layer 108B formed between the lead frames 140 and 142 and at least the bottom body portion 110, compared to the exemplary embodiment of FIG. 1.

That is, when the bottom body portion 110 is made of an electrically conductive material, the insulative layer 108B is formed to prevent short circuit from occurring between the bottom body portion 110 and the lead frames 140 and/or 142. The insulative layer 108B may not be formed at a region in which the lead frame 140 or 142 is coupled to the light source 130.

The insulative layer 108B may be made of an electrically insulative material such as $SiO_2$, $Al_2O_3$ or a resin material. The present disclosure is not limited thereto.

Figure 11:
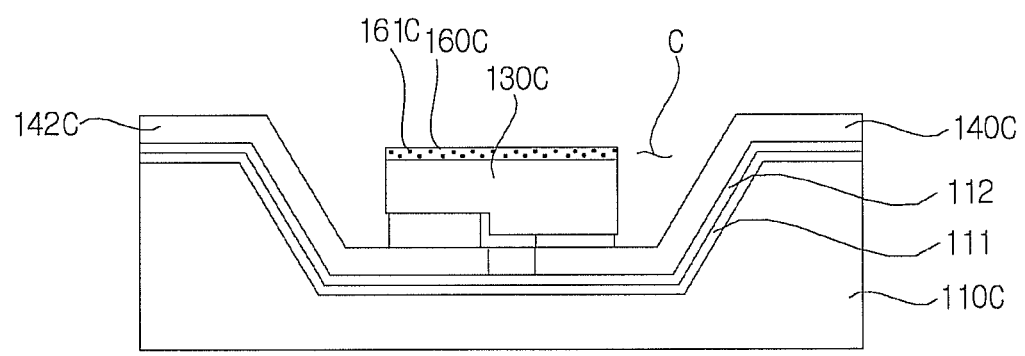
FIG. 11 is a cross-sectional view of a light emitting device package according to still yet another exemplary embodiment.

FIG. 11 is a cross-sectional view of a light emitting device package 100C according to still yet another exemplary embodiment.

Referring to FIG. 11, the light emitting device package 100C may further include a body 110C, first and second lead frames 140C and 142C disposed on the body 110C, and a light source 130C disposed over the body 110C and electrically connected to the first and second lead frames 140C and 142C. The light source 130C may be electrically connected to the first and second lead frames 140C and 142C in a flip-chip manner. A sealing material 160C containing organic particles 161C may be formed on a top surface of the light source 130C.

The body 110C may include a silicon, synthetic resin or metal material and may include inclined side wall faces around the light source 130C.

The first and second lead frames 140C and 142C are electrically isolated from each other and supply an electrical power to the light source 130C. The first and second lead frames 140C and 142C may enhance light extraction efficiency by reflecting light emitted by the light source 130C, and may discharge heat generated by the light source 130C.

A reflective layer 111 may be formed on the body 110C to enable emitted light to be more effectively extracted in a front direction of the package. Generally, the reflective layer 111 may be made of a metal having a high reflection coefficient such as silver (Ag) or aluminum (Al). In this case, an electrically insulative layer 112 may be further formed on the reflective layer 111 to prevent the reflective layer 112 from being electrically connected to the first and second lead frames 140C and 142C.

A cavity C is formed in the body 110C to accommodate the light source 130C.

Figure 12:
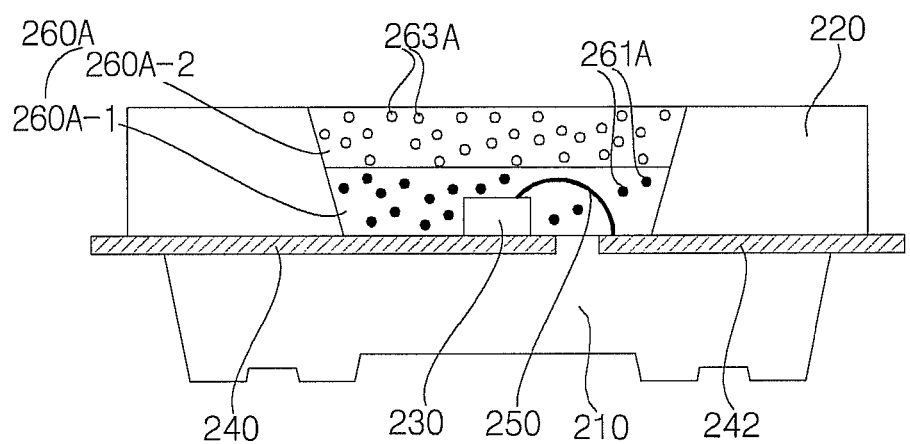
FIG. 12 is a cross-sectional view of a light emitting device package according to still yet another exemplary embodiment.

FIG. 12 is a cross-sectional view of a light emitting device package 200A according to still yet another exemplary embodiment.

Referring to FIG. 12, the light emitting device package 200A may be different from that of the embodiment of FIG. 6 in that a sealing material 260A of this exemplary embodiment includes at least a first sealing material layer 260A-1 and a second sealing material layer 260A-2 on the first sealing material layer 260A-1.

Organic particles 261A are dispersed in the first sealing material layer 260A-1 while fluorescent substances 263A are dispersed in the second sealing material layer 260A-2. The present disclosure is not limited thereto. Organic particles 261A may be dispersed in the second sealing material layer 260A-2 while fluorescent substances 263A may be dispersed in the first sealing material layer 260A-1.

Figure 13A:
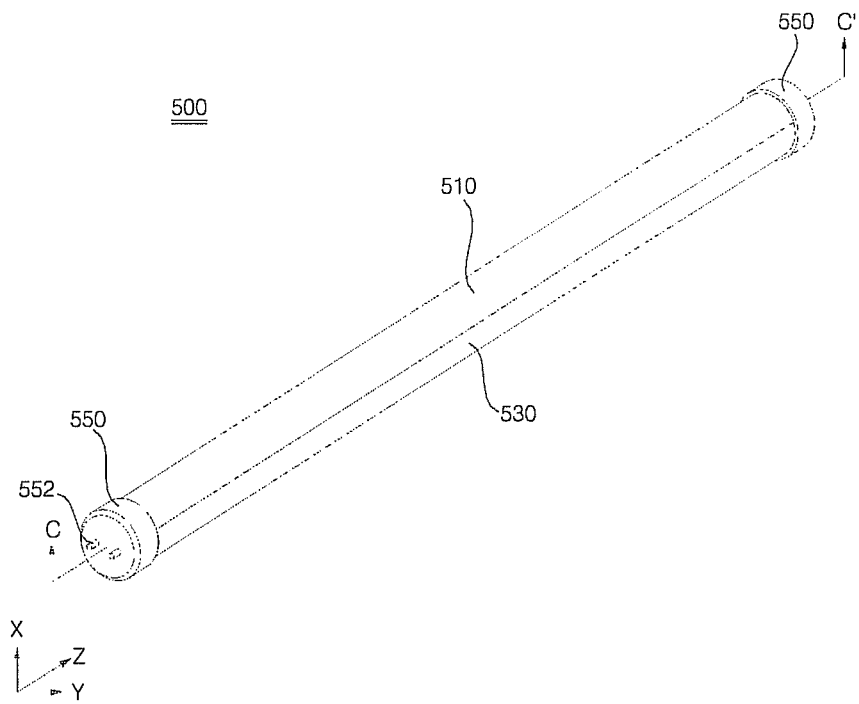
FIG. 13A is a perspective view of an illumination device including a light emitting device package according to one exemplary embodiment.
Figure 13B:
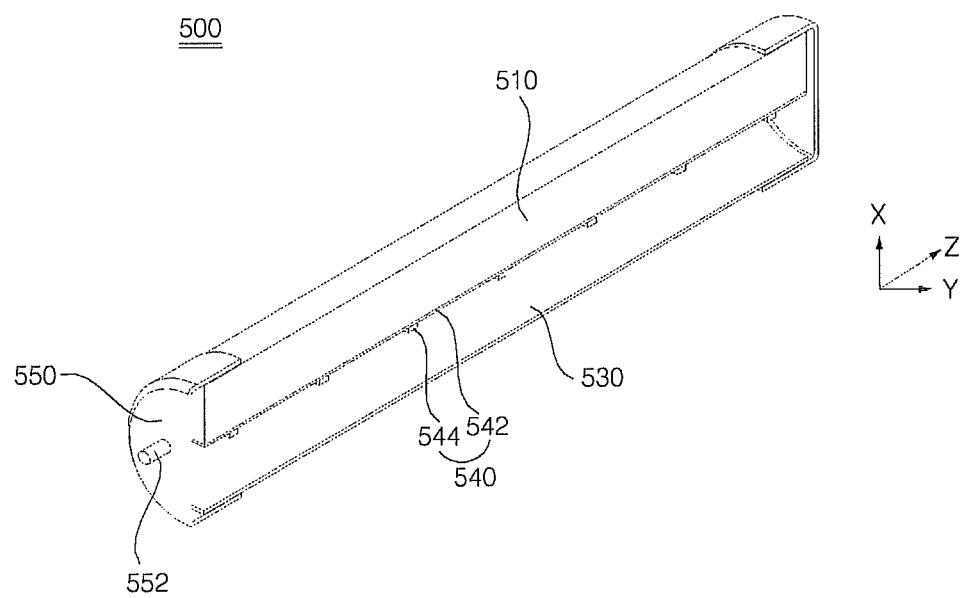
FIG. 13B is a cross-sectional view taken at a line C-C' of the illumination device of FIG. 13A.

FIG. 13A is a perspective view of an illumination device 500 including a light emitting device package according to one exemplary embodiment. FIG. 13B is a cross-sectional view taken at a line C-C' of the illumination device of FIG. 13A.

Hereinafter, in order to describe the illumination device 500 in a more detailed manner, a length direction Z, a horizontal direction Y perpendicular to the length direction Z and a height direction X upright to a plane formed by the directions Z and Y of the illumination device 500 will be referenced.

FIG. 13B illustrates a cross-section taken according to a plane formed by the directions Z and X and viewed in the horizontal direction Y.

Referring to FIG. 13A and FIG. 13B, the illumination device 500 includes a body 510, a cover 539 coupled to the body 510, and finishing caps 550 disposed at both ends of the body 510 respectively.

A light emitting device module 540 is coupled to the body 510 at a lower face of the body 510. Thus, the body 510 may be made of a metal material having excellent thermal conductivity and heat discharge rate to discharge heat generated from light emitting device packages 544 from an upper face of the body 510.

The light emitting device packages 544 may be arranged on a PCB 542 in a plural-row or plural-color form to form a light emitting device package array. The light emitting device packages 544 may be spaced from each other by a regular interval or, if necessary, with varying intervals to adjust brightness, etc. of the illumination device 500. The PCB 542 may be made of an FR4 material or be formed of a metal core PCB (MCPCB).

In particular, the light emitting device packages 544 according to one exemplary embodiment may include a light emitting device (not shown) having an improved light emitting efficiency and lowered operating voltage, and thus may realize the light emitting device module 540 having an enhanced luminance and light emitting efficiency.

The cover 530 may be formed in a cylindrical shape to encompass the lower face of the body 510, although the present disclosure is not limited thereto.

The cover 530 may protect the light emitting device module 540 therein from external contaminants, etc. The cover 530 may contain light diffusion particles to achieve anti-glare effects and uniform emission of light generated from the light emitting device packages 544. At least one of the inner and outer surfaces of the cover 530 may be provided with a prism pattern. Also, a fluorescent substance layer may be coated over at least one of the inner and outer surfaces of the cover 530.

Since light generated from the light emitting device packages 544 is outwardly emitted through the cover 530, the cover 530 should include high light transmittance and heat resistance sufficient to endure heat generated from the light emitting device packages 544. To this end, the cover 630 may be made of polyethylene terephthalate (PET), polycarbonate (PC) or polymethylmethacrylate (PMMA).

The finishing caps 550 may be disposed at both ends of the body 510 and function to seal a power supply device (not shown). Each finishing cap 650 is provided with power pins 552, so that the illumination device 500 in accordance with the illustrated embodiment may be directly connected to a terminal, which is provided for a conventional fluorescent lamp, without an additional connector.

Accordingly, using the mold member containing the organic particles, there may be provided an illumination device having enhanced heat discharge rate and thus reliability.

Figure 14:
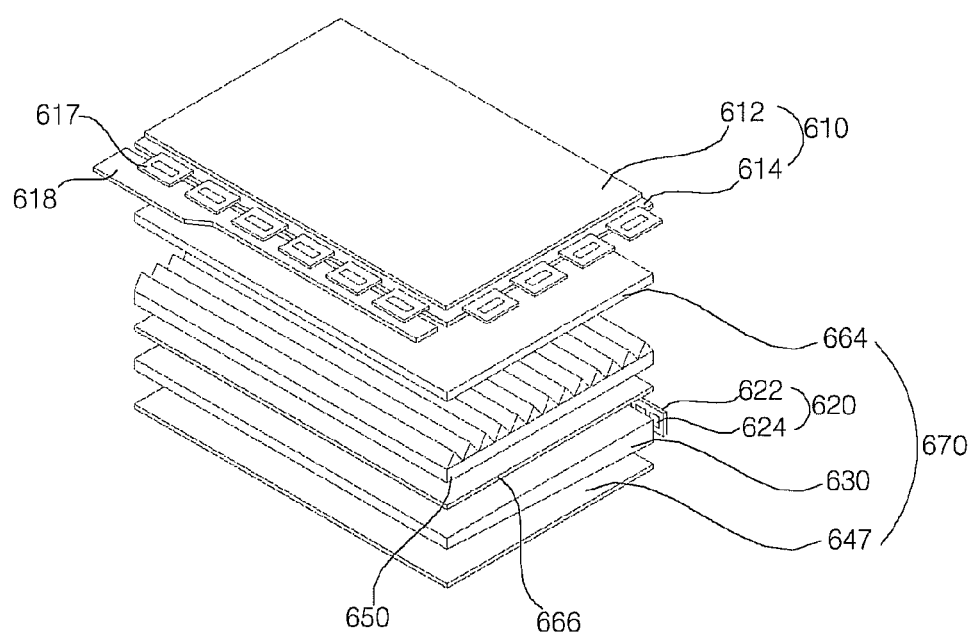
FIG. 14 is a disassembled perspective view of a liquid crystal display device including a light emitting device package according to one exemplary embodiment.

FIG. 14 is a disassembled perspective view of a liquid crystal display device 600 including a light emitting device package according to one exemplary embodiment.

FIG. 14 illustrates an edge-light type liquid crystal display device 600. The liquid crystal display device 600 may include a liquid crystal display panel 610 and a backlight unit 670 to supply light to the liquid crystal display panel 610.

The liquid crystal display panel 610 may display an image using the light supplied, from the backlight unit 670. The liquid crystal display panel 610 may include a color filter substrate 612 and a thin film transistor substrate 614, which are opposite each other with liquid crystals interposed therebetween.

The color filter substrate 612 may realize the color of an image displayed on the liquid crystal display panel 610.

The thin film transistor substrate 614 is electrically connected to a PCB 618, on which a plurality of circuit elements is mounted, by means of a drive film 617. The thin film transistor substrate 614 may apply drive voltage provided by the PCB 618 to liquid crystals in response to a drive signal transmitted from the PCB 618.

The thin film transistor substrate 614 may include thin film transistors and pixel electrodes in the form of thin films formed on another substrate made of a transparent material such as glass or plastic.

The backlight unit 670 includes a light emitting device module 620 to emit light, a light guide plate 630 to change light emitted from the light emitting device module 620 into planar light and to transmit the planar light to the liquid crystal display panel 610, a plurality of films 650, 666 and 664 to achieve uniformity in brightness distribution and improved vertical incidence of light emerging from the light guide plate 630, and a reflection sheet 640 to reflect light emitted rearwards from the light guide plate 630 toward the light guide plate 630.

The light emitting device module 620 may include a plurality of light emitting device packages 624 and a PCB 622 on which the plurality of light emitting device packages 624 is mounted to form an array.

In particular, the light emitting device packages 624 according to one exemplary embodiment may include a light emitting device (not shown) having an improved light emitting efficiency and lowered operating voltage, and thus may realize the backlight unit 670 having an enhanced luminance and light emitting efficiency.

Meanwhile, the backlight unit 670 may include a diffusion film 666 to diffuse light incident thereupon from the light guide plate 630 toward the liquid crystal display panel 610, and a prism film 650 to condense the diffused light so as to enhance vertical light incidence. The backlight unit 670 may further include a protective film 664 to protect the prism film 650.

Figure 15:
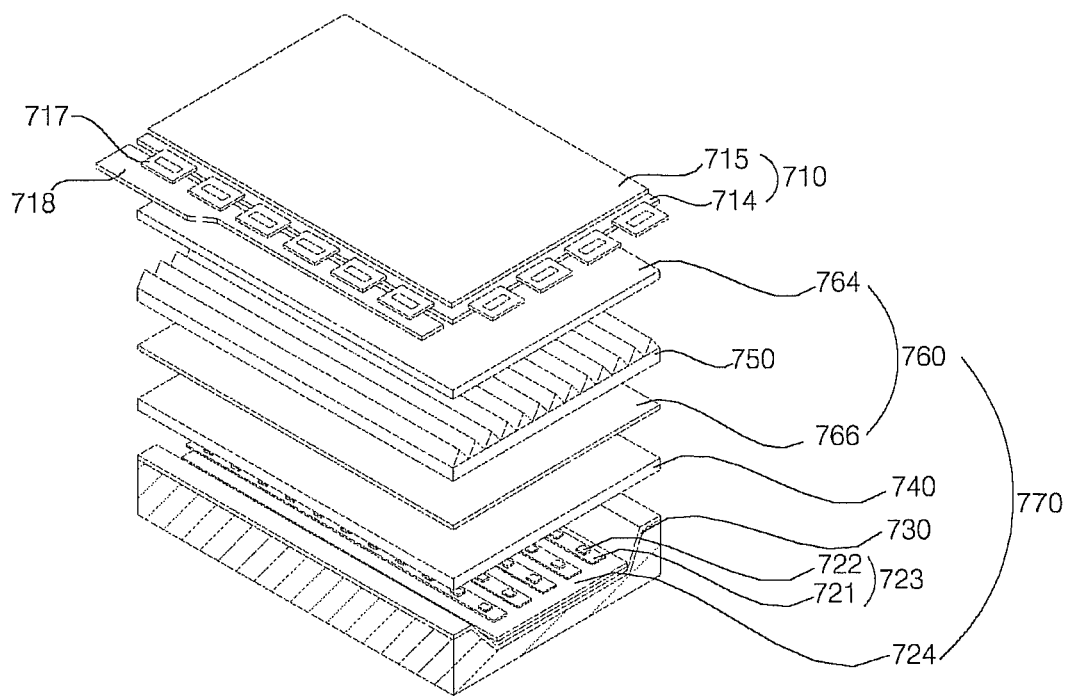
FIG. 15 is a disassembled perspective view of a liquid crystal display device including a light emitting device package according to another exemplary embodiment.

FIG. 15 is a disassembled perspective view of a liquid crystal display device 700 including a light emitting device package according to another exemplary embodiment. The same configuration as that illustrated in FIG. 14 and described with reference to FIG. 14 will not be repeatedly described in detail.

FIG. 15 illustrates a direct type liquid crystal display device 700 including a liquid crystal display panel 710 and a backlight unit 770 to supply light to the liquid crystal display panel 710.

The liquid crystal display panel 710 is identical to that of FIG. 14 and, as such, no detailed description thereof will be given.

The backlight unit 770 may include a plurality of light emitting device modules 723, a reflection sheet 724, a lower chassis 730 in which the light emitting device modules 723 and reflection sheet 724 are accommodated, and a diffusion sheet 740 and a plurality of optical films 760, which are disposed over the light emitting device modules 723.

Each light emitting device module 723 may include a plurality of light emitting device packages 722, and a PCB 721 on which the plurality of light emitting device packages 722 is mounted to form an array.

In particular, the light emitting device packages 722 according to one exemplary embodiment may include a light emitting device (not shown) having improved light emitting efficiency and lowered operating voltage, and thus may realize the backlight unit 770 having an enhanced luminance and light emitting efficiency.

The reflection sheet 724 reflects light generated by the light emitting device packages 722 toward the liquid crystal display panel 710, to achieve an enhancement in light utilization efficiency.

Meanwhile, the light generated from the light emitting device modules 723 is incident upon the diffusion sheet 740. The optical films 760 are disposed over the diffusion sheet 740. The optical films 760 may include a diffusion film 766, a prism film 750 and a protective film 764.

Figure 16:
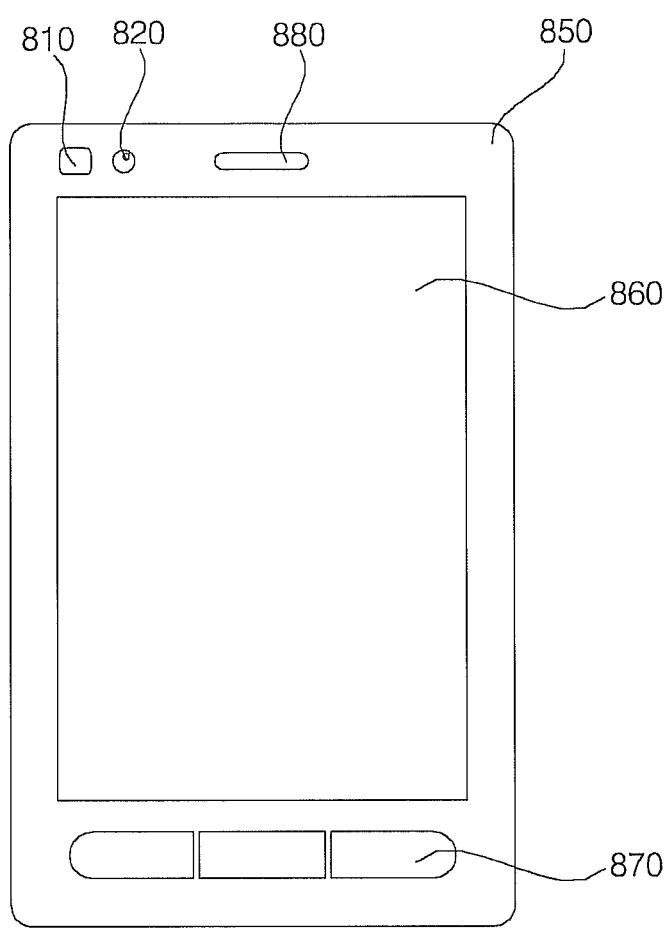
FIG. 16 is a top view of a mobile communication terminal including a light emitting device package according to one exemplary embodiment.

FIG. 16 is a top view of a mobile communication terminal 800 including a light emitting device package according to one exemplary embodiment.

Referring to FIG. 16, the mobile communication terminal 800 is provided as a mobile communication device including a light emitting device package 820, although the present disclosure is not limited thereto.

The mobile communication terminal 800 includes, at a front portion thereof, a receiving unit 880 to output a voice signal, etc. of a call counterpart, a screen 860 used as a display, an operation switch 870 to initiate or terminate a call, a camera 810 for a video communication or image capture, etc. or the like. The screen 860 may include a touch panel, etc. to serve not simply as a display but also as an input device.

The mobile communication terminal 800 may include a case 850 made of a plastic material and having a particular color such as a white color. In this way, there is provided the mobile communication terminal including a light emitting device package having the excellent heat discharge rate and thus reliability.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments include been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device package comprising:
a light source;
a lead frame to mount the light source thereon and being electrically connected to the light source, the lead frame comprising first and second electrically conductive lead frames being spaced from each other;
a mold member disposed over the light source and including a sealing material, a fluorescent substance, and organic particles over the lead frame, wherein the entire organic particle is organic, wherein each of the organic particles comprises a coating layer to coat the organic particle, wherein the coating layer has an index of refraction different from that of the organic particle,
wherein a proportion of the organic particles to the sealing material is in a range of 1 wt % to 20 wt %.

2. The package of claim 1, wherein the organic particles includes at least one selected from a group consisting of PTFE (polytetrafluoroethylene), PSTm, phenolic resin, PMMA (polymethylmethacrylate), PVC and styrene-copolymer.

3. The package of claim 1, wherein each of the organic particles has an index of refraction in a range of 1.6 to 1.7.

4. The package of claim 1, wherein the organic particles include at least one of spherical, hexahedral, cylindrical and regular polyhedral shapes.

5. The package of claim 1, wherein the organic particles are formed as combinations of two or more of a sphere, hexahedron, cylinder and regular polyhedron.

6. The package of claim 1, wherein the organic particles include a width or diameter in a range of 1 nm to 80000 nm.

7. The package of claim 1, wherein the coating layer has an index of refraction larger than of the organic particle.

8. The package of claim 1, wherein each of the organic particles comprises a hollow space formed therein.

9. The package of claim 1, further comprising a body having a cavity formed therein to accommodate the light source,
wherein the mold member fills the cavity.

10. The package of claim 9, further comprising a reflective layer formed on a side wall surface of the cavity.

11. The package of claim 9, further comprising a hole formed in a bottom portion of the body, the hole being disposed beneath the light source.

12. The package of claim 9, further comprising a sheet disposed over the body to cover the cavity, wherein the sheet comprises at least one selected from among titanium dioxide ($TiO_2$), silicon dioxide ($SiO_2$), zinc oxide (ZnO), barium sulfate ($BaSO_4$), calcium carbonate ($CaCO_3$), magnesium carbonate ($MgCO_3$), aluminum hydroxide ($Al(OH)_3$) and clay.

13. The package of claim 1, wherein the sealing material comprises silicon, epoxy resin and/or another resin material.

14. The package of claim 1, wherein the sealing material comprises at least a first sealing material layer and a second sealing material layer on the first sealing material layer.

15. The package of claim 14, wherein the organic particles are placed in the first sealing material layer, and fluorescent substances are placed in the second sealing material layer.

16. The package of claim 1, wherein the sealing material further comprises fluorescent substances to change a wavelength of light generated from the light source.

17. The package of claim 1, wherein the sealing material further comprises a light diffusive material to diffuse light emitted from the light source.

18. An illumination device comprising a light emitting device package, the package comprising:
a light source;
a lead frame to mount the light source thereon and being electrically connected to the light source, the lead frame comprising first and second lead frames being spaced from each other;
a body having a cavity formed therein to accommodate the light source and lead frame; and
a mold member disposed over the light source and including a sealing material and organic particles over the lead frame, wherein the entire organic particle is organic, wherein each of the organic particles comprises a coating layer to coat the organic particle, wherein the coating layer has an index of refraction different from that of the organic particle,
wherein the organic particles is at least one of PTEE (polytetrafluoroethylene), PSTm, phenolic resin, PMMA (polymethylmethacrylate), PVC or styrene-copolymer, and
wherein a proportion of the organic particles to the sealing material is in a range of 0.5 wt % to 30 wt %.

19. A backlight unit comprising a light emitting device package, the package comprising:
a light source;
a lead frame to mount the light source thereon and being electrically connected to the light source, the lead frame comprising first and second lead frames being spaced from each other;
a body having a cavity formed therein to accommodate the light source and lead frame; and
a mold member disposed over the light source and including a sealing material and entirely organic particles over the lead frame, wherein the entire organic particle is organic, wherein each of the organic particles comprises a coating layer to coat the organic particle, wherein the coating layer has an index of refraction different from that of the organic particle,
wherein the organic particles is at least one of PTEE (polytetrafluoroethylene), PSTm, phenolic resin, PMMA (polymethylmethacrylate), PVC or styrene-copolymer, and
wherein a proportion of the organic particles to the sealing material is in a range of 0.5 wt % to 30 wt %.

* * * * *